(12) United States Patent
Zhu (10) Patent No.: US 9,030,179 B2
(45) Date of Patent: May 12, 2015

(54) SWITCHING REGULATOR WITH VARIABLE COMPENSATION

(75) Inventor: Zhaohui Zhu, Sunnyvale, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 94 days.

(21) Appl. No.: 13/555,460

(22) Filed: Jul. 23, 2012

(65) Prior Publication Data

US 2013/0027134 A1 Jan. 31, 2013

Related U.S. Application Data

(60) Provisional application No. 61/511,549, filed on Jul. 26, 2011.

(51) Int. Cl.
| | | |
|---|---|---|
| G06F 1/00 | (2006.01) |
| H03F 3/45 | (2006.01) |
| H02M 3/156 | (2006.01) |
| H02M 1/00 | (2006.01) |

(52) U.S. Cl.
CPC ........... *H03F 3/45179* (2013.01); *H02M 3/156* (2013.01); *H02M 2001/0025* (2013.02)

(58) Field of Classification Search
USPC ......................................... 323/282–285, 280
See application file for complete search history.

(56) References Cited

U.S. PATENT DOCUMENTS

| | | | |
|---|---|---|---|
| 5,497,119 A * | 3/1996 | Tedrow et al. ................. | 327/540 |
| 5,668,501 A | 9/1997 | Venes | |
| 6,552,517 B1 | 4/2003 | Ribellino et al. | |
| 7,019,502 B2 * | 3/2006 | Walters et al. ................ | 323/282 |
| 7,116,164 B1 | 10/2006 | Aram | |
| 7,176,668 B2 | 2/2007 | Oswald et al. | |
| 7,315,153 B2 | 1/2008 | Tazawa et al. | |
| 7,423,414 B1 | 9/2008 | Culpepper et al. | |
| 7,919,952 B1 * | 4/2011 | Fahrenbruch ................. | 323/222 |

OTHER PUBLICATIONS

International Search Report and Written Opinion—PCT/US2012/047859—ISA/EPO—Oct. 5, 2012.

* cited by examiner

*Primary Examiner* — Adolf Berhane
*Assistant Examiner* — Henry Lee, III
(74) *Attorney, Agent, or Firm* — Fountainhead Law Group P.C.

(57) ABSTRACT

A switching regulator circuit includes a power stage and a compensation network. The compensation network includes a programmable transconductance ($g_m$), having a first selectable transconductance such a closed loop transfer function of the switching regulator circuit may be characterized by a first transfer function having a having a first DC open loop gain and a first bandwidth, and by a second transfer function having a second DC open loop gain and a second bandwidth.

17 Claims, 5 Drawing Sheets

SWITCHING REGULATOR WITH VARIABLE COMPENSATION

CROSS REFERENCE TO RELATED APPLICATIONS

The present disclosure claims priority to U.S. Provisional App. No. 61/511,549 filed Jul. 26, 2011, the content of which is incorporated herein by reference in its entirety for all purposes.

BACKGROUND

Unless otherwise indicated herein, the approaches described in this section are not prior art to the claims in this application and are not admitted to be prior art by inclusion in this section.

Step down DC-DC voltage regulators are common components in modern electronic devices. The buck converter is a popular device for converting a higher voltage source to a lower voltage level that can be used by the electronics components in an electronic device. Typical input voltages may range from 4.6V to 16V, and typical output voltages may range from 0.8V to 5V. A buck converter comprises power stage and a feedback compensation network. The power stage generates a switched signal and typically includes an output filter to smooth out the output voltage. The feedback compensation network may regulate the output voltage by varying the duty cycle of the power stage.

The dynamic response of a voltage regulator informs the circuit designer how the circuit will behave. The dynamic response may be represented by the closed loop transfer function of the voltage regulator. The bandwidth, which is sometimes defined from DC to the cutoff frequency, tells how quickly the circuit will respond to changes in the output voltage during operation of the circuit. The DC open loop gain tells how accurate the circuit will be in compensating for changes in the output voltage; for example, whether the circuit will overshoot or undershoot, ringing, and so on. Acceptable performance of the circuit depends on being able to control or otherwise design for these parameters.

SUMMARY

In some embodiments, a circuit comprises a switching power circuit configured for connection to an input voltage. The switching power circuit provides an output that can be supplied as an output voltage to a load. The circuit further comprises a programmable compensation circuit having a selectable transconductance ($g_m$). The compensation circuit is connected to the output voltage and provides feedback to the switching power circuit. The compensation circuit can be configured in a first configuration characterized by a transfer function having a first DC open loop gain and a first bandwidth. The compensation circuit can be configured in a second configuration characterized by a transfer function having a second DC open loop gain and a second bandwidth.

In some embodiments, the compensation circuit includes a programmable transconductance amplifier having a selectable $g_m$. An input value may be provided to select the $g_m$ of the transconductance amplifier.

In some embodiments, compensation circuit includes a programmable voltage divider.

In some embodiments, the compensation circuit includes a programmable RC filter.

In some embodiments, the circuit is incorporated in a buck converter.

DETAILED DESCRIPTION

Disclosed embodiments relate to switching regulators having a programmable compensation network. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
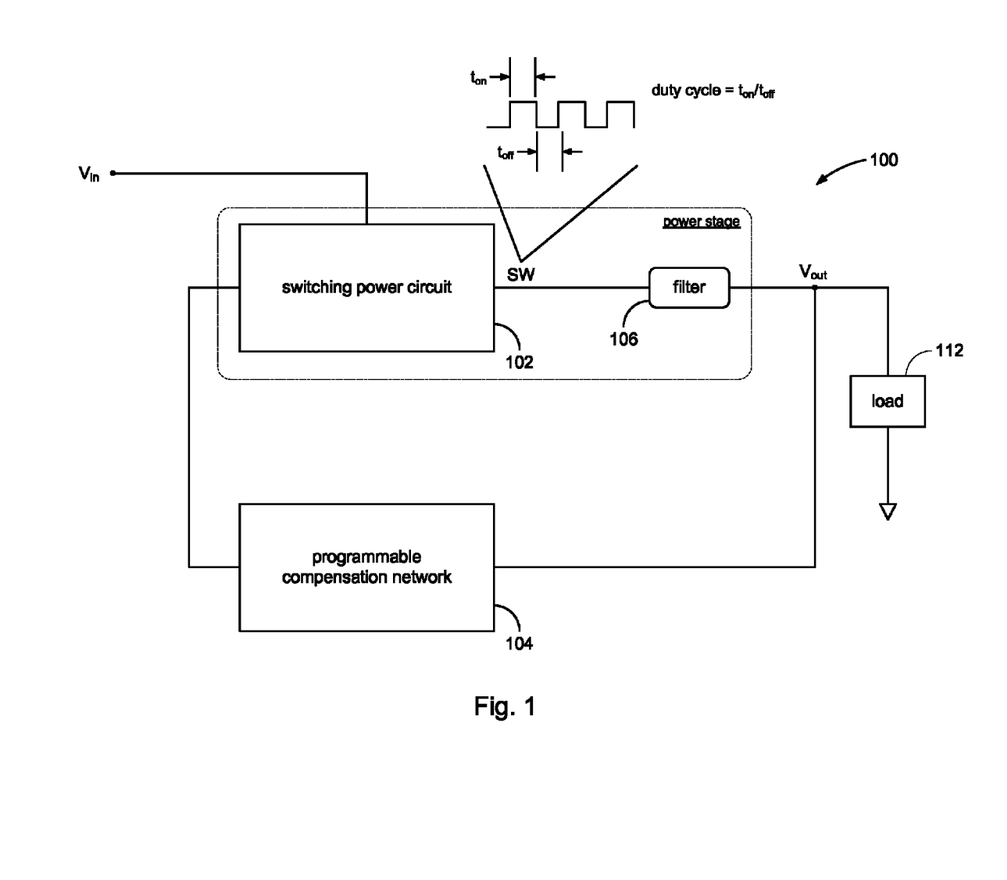
FIG. 1 is a high level block diagram of a switching regulator circuit in accordance with the present disclosure.

Referring to FIG. 1, a switching regulator circuit 100 may receive an input voltage $V_{in}$ and produce an output voltage $V_{out}$. The output voltage $V_{out}$ may be used to drive a load 112. In accordance with embodiments of the present invention, the switching regulator circuit 100 may include a switching power circuit 102 which receives the input voltage $V_{in}$. The input voltage $V_{in}$ may range from 4.5V to 16V; however, other voltage levels are possible of course. The switching power circuit 102 may output a switching signal SW that is supplied, via a filter 106, to the load 112 as the output voltage $V_{out}$. In some embodiments, the switching signal SW is a square wave. The switching power circuit 102 and filter 106 may be collectively referred to as the "power stage."

In accordance with the present disclosure, a programmable compensation network 104 may compensate for variations in the output voltage $V_{out}$ that may result from variations in the load 112, temperature fluctuation, and so on. In some embodiments, for example, the programmable compensation network 104 may provide a feedback control signal which feeds into the switching power circuit 102 to the control the duty cycle of the switching signal SW, thereby regulating the output voltage $V_{out}$.

In some embodiments, the switching regulator circuit 100 is a buck regulator, where the output voltage $V_{out}$ is less than the input voltage $V_{in}$. As will be explained below, the output voltage $V_{out}$ can be readily programmed by the user to different operating voltages. In accordance with principles of the present disclosure, the programmable compensation network 104 can ensure stable circuit operation for each of the different operating voltages.

Figure 2:
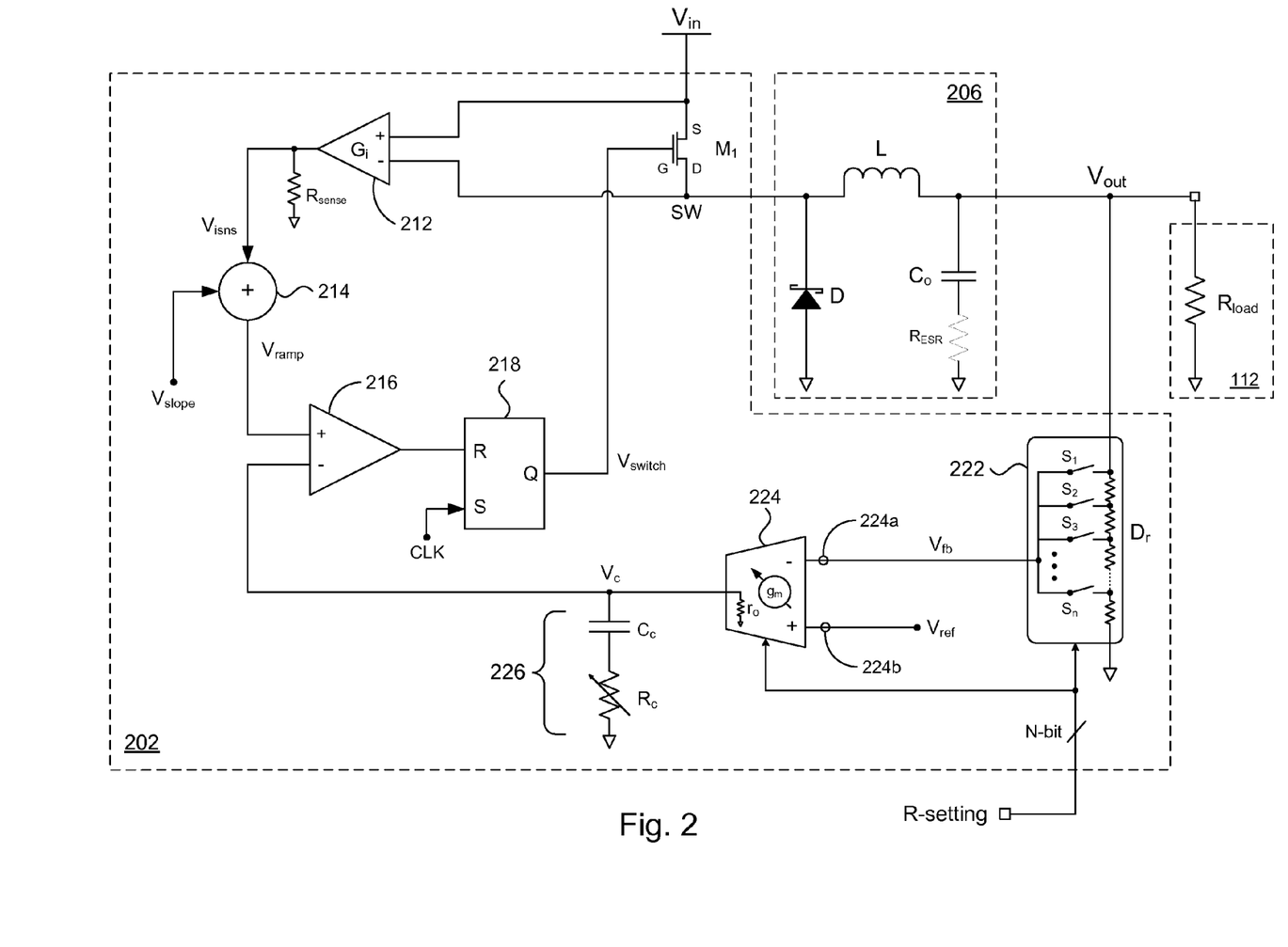
FIG. 2 shows some circuit details of a switching regulator circuit in accordance with some embodiments.

Referring to FIG. 2, in some embodiments, the switching regulator circuit 100 comprises two components: device 202 and external filter 206. The device 202 may be provided as an integrated circuit (IC) device. The external filter 206, as the name suggests, comprises components that are typically too large or impractical to fabricate on the IC device 202 and thus may be provided external to the IC device (off-chip). The external filter 206 may be any suitable design. For example, FIG. 2 shows the external filter 206 comprises a diode D (e.g., a Schottky diode), an inductor L, and an output capacitor $C_o$ configured in a pi network. The figure also includes a resistor $R_{ESR}$ which represents the total equivalent series resistance (ESR) of the output capacitor $C_o$, which is sometimes referred to as the parasitic resistance. The load 112 is represented by resistor $R_{loadnd}$.

The device 202 may include the switching power circuit 102 (FIG. 1) and the programmable compensation network 104. In some embodiments, the switching power circuit 102 may be a current mode control switching power circuit. For example, the switching power circuit 102 may comprise a switch $M_1$, a current sense amplifier 212, a summing circuit 214, a comparator 216, and an RS flip-flop 218.

The switch $M_1$ may have an input for a connection to the input voltage $V_{in}$. The switch $M_1$ may be controlled by a switching control signal $V_{switch}$ to produce the switching signal SW. In an embodiment, for example, the switch $M_1$ may be a field effect transistor (FET) device. A source terminal S of the FET $M_1$ may be connected to the input voltage $V_{in}$. A gate terminal G of the FET $M_1$ may be connected to a source of the switching control signal $V_{switch}$ to produce the switching signal SW, which may be obtained from the drain terminal D of switch $M_1$.

The current sense amplifier 212 may be connected to the switch $M_1$ to sense the current flow through the inductor L on each switching cycle. For example, the current sense amplifier 212 may be connected to the source S and drain D terminals of the FET $M_1$ to sense current flow through the FET, which effectively senses the current flow through the inductor L. An output resistor $R_{sense}$ may be provided at an output of the current sense amplifier 212 to produce a current sense voltage $V_{isns}$. The summing circuit 214 may combine the current sense voltage $V_{isns}$ with a slope compensation signal $V_{slope}$ obtained from a voltage ramp generator (not shown). In some embodiments, the voltage ramp generator (not shown) may be provided on-chip (i.e., fabricated on the device 202), and in other embodiments the voltage ramp generator may be provided off-chip. The output of the summing circuit 214 is a ramp signal $V_{ramp}$.

The ramp signal $V_{ramp}$ may be connected to an input of the comparator 216. In some embodiments, for example, the ramp signal $V_{ramp}$ is connected to a non-inverting input of the comparator 216. Since the ramp signal $V_{ramp}$ is based on the current flow through switch $M_1$, the ramp signal represents a current mode feedback signal. Another feedback control signal, produced in the programmable compensation network 104 (discussed below), may connect to another input of the comparator 216 (e.g., an inverting input). As will be explained below, the feedback control signal produced in the programmable compensation network 104 is a voltage mode feedback signal. An output of the comparator 216 may drive an RS flip-flop 218 in accordance with the current mode feedback signal ($V_{ramp}$) and the voltage mode feedback signal. In particular, the output of the comparator 216 may drive the RESET input of the RS flip-flop. A clock signal CLK may feed into the SET input of the RS flip-flop 218. The clock signal CLK may be provided on-chip or off-chip. An output Q of the RS flip-flop 218 may be connected to the switch $M_1$ to serve as the switching control signal $V_{switch}$ for the switch, and in particular the switching control signal controls the duty cycle of the switch. In an embodiment, the output Q may be connected to the gate terminal G of FET $M_1$.

In some embodiments, the programmable compensation network 104 may comprise a programmable resistor network 222, a programmable transconductance amplifier 224, and a programmable RC filter 226. The programmable resistor network 222 may be configured as a voltage divider, and connected to the output voltage $V_{out}$ to generate a feedback voltage $V_{fb}$ that is proportional to $V_{out}$. Accordingly, the programmable resistor network 222 may also be referred to as a programmable feedback divider. An input value R-setting may be provided off-chip; e.g., by a user, another circuit, etc. In some embodiments, for example, the input value R-setting may be a four-bit data value used to configure the programmable resistor network 222 with one out of sixteen possible voltage divider ratios (taps), $D_r$; although more or less bits may be provided. The level of the output voltage $V_{out}$ may be selected by programming the programmable resistor network 222 using the input value R-setting.

In accordance with principles of the present disclosure, the programmable compensation network 104 includes a programmable transconductance amplifier 224. The programmable transconductance amplifier 224 may include a pair of differential inputs 224a, 224b. The feedback voltage $V_{fb}$ from the programmable resistor network 222 may be connected to an inverting input 224a. A reference voltage $V_{ref}$ may be connected to a non-inverting input 224b. In some embodiments, the reference voltage $V_{ref}$ may be about 0.8V, and may be provided from an on-chip source or the reference source may be off-chip.

In some embodiments, the programmable transconductance amplifier 224 may be programmed using the input value R-setting, as depicted in FIG. 2. In particular, the transconductance ($g_m$) value of the programmable transconductance amplifier 224 is programmable. In other embodiments, a second input value other than the input value R-setting may be used to program the programmable transconductance amplifier 224. The second input value may have the same, or a different, number of bits of resolution as the input value R-setting.

Figure 2A:
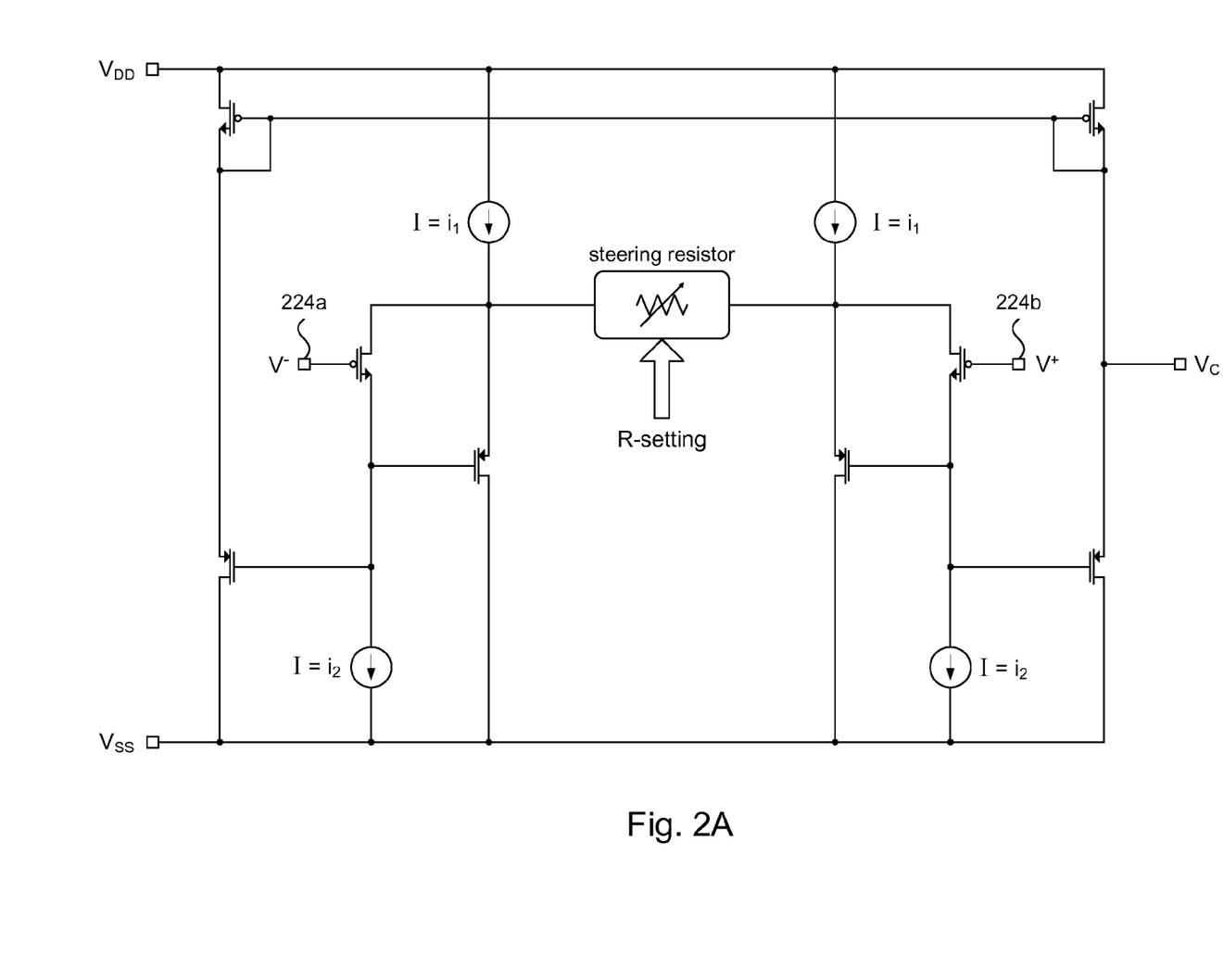
FIG. 2A illustrates an example of a programmable transconductance amplifier.

Referring for a moment to FIG. 2A, an illustrative embodiment of the programmable transconductance amplifier 224 is shown. The particular circuit shown in the figures shows an operational transconductance amplifier (OTA). A steering resistor sets the transconductance $g_m$ of the OTA. More particularly, the steering resistor may be programmable thereby allowing the transconductance $g_m$ of the OTA to be determined according to the input value R-setting.

Completing the circuit description of FIG. 2, an output $V_c$ of the programmable transconductance amplifier 224 may connect to the programmable RC filter 226. The programmable RC filter 226 may be programmed, for example, via a programmable resistor $R_c$. Programmable resistors, such as the resistor $R_c$ and the steering resistor in FIG. 2A, are known devices. Any of numerous known suitable designs may be used.

The output $V_c$ of the programmable transconductance amplifier 224 may serve as the feedback control signal that feeds into the comparator 216, as described above. As will be explained below, the programmable compensation network 104 of the present disclosure facilitates selection of the operating output voltage $V_{out}$. In addition, the programmable compensation network 104 facilitates improving the bandwidth of the switching regulator circuit 100 (e.g., having a high crossover frequency) thereby improving circuit response time. The programmable compensation network 104 also facilitates improving accuracy of the switching regulator circuit 100 by maximizing the circuit DC open loop gain without creating instability. In accordance with principles of the present disclosure, both bandwidth and DC open loop gain can be improved without trading off one for the other.

As can be seen from FIG. 2, the output voltage $V_{out}$ can be set by setting the voltage divider ratio $D_r$ of the programmable resistor network 222. $V_{out}$ relates to $V_{fb}$ by the relation $V_{fb}=V_{out} \times D_r$. By operation of the feedback loop of the programmable compensation network 104, the programmable transconductance amplifier 224 will drive the output voltage $V_{out}$ to maintain $V_{fb}=V_{ref}$. Therefore, the output voltage $V_{out}$ can be determined from $$V_{out} = \frac{V_{ref}}{D_r}.$$

For example, assuming $V_{ref}$ is 0.8V, $V_{out}$ can be set to 0.8V, 1.6V, 2V, and 3.2V by providing the programmable resistor network 222 with selectable divider ratios $D_r$ of 1, 0.5, 0.4, and 0.25, respectively. If the input value R-setting is a two-bit value, then the setting "00" may be used to set the divider ratio $D_r$ to 1, the setting "01" may be used to set the divider ratio to 0.5, the setting "10" may be used to set the divider ratio to 0.4, and the setting "11" may be used to set the divider ratio to 0.25.

In operation, the clock signal CLK causes the switch $M_1$ to produce a switching signal SW which is filtered by the external filter 206 to produce the output voltage $V_{out}$. The output voltage $V_{out}$ can then be supplied to the load 112. The output voltage $V_{out}$ is fed back to the programmable transconductance amplifier 224 via the programmable resistor network 222 as feedback voltage $V_{fb}$, and compared against the reference voltage $V_{ref}$. The programmable transconductance amplifier 224 will produce an output voltage, namely the control voltage $V_c$. The RC filter 226 smooths out fluctuations in the control voltage $V_c$. The control voltage $V_c$ feeds into the comparator 216, thus forming a voltage controlled feedback loop.

In the power stage, the current sense amplifier 212 effectively senses the current flow through the inductor L, and produces a voltage level that is proportional to the sensed current, namely, the current sense voltage $V_{isns}$. The current sense voltage $V_{isns}$ is combined with the slope compensation signal $V_{slope}$ to produce $V_{ramp}$, which feeds into the comparator 216 thus forming a current controlled feedback loop.

In the beginning of a switching period, the control voltage $V_c$ is higher than $V_{ramp}$, since $V_{fb}$ is 0V. This will cause the output of the comparator 216 to be LO, taking the RS flip-flop 218 out of reset. The clock signal CLK will turn the switch $M_1$ ON. As current begins to flow through switch $M_1$ and inductor L, the current sense voltage $V_{isns}$ (and hence $V_{ramp}$) will begin to ramp up. At the same time, the current flow will cause $V_{fb}$ to ramp up as well. When $V_{fb}=V_{ref}$ the control voltage $V_c$ will go to 0V. When $V_{ramp} \geq V_c$, the comparator 216 will go HI and put the RS flip-flop 218 in reset, thus turning the switch $M_1$ OFF.

As the current flow through the inductor drops, $V_{fb}$ will decay and fall below $V_{ref}$. This will cause the control voltage $V_c$ to once again become higher than $V_{ramp}$, thus repeating the cycle. Setting the voltage divider ration $D_r$ determines the ON and OFF switching times of the switch $M_1$, and hence the duty cycle of the switching signal SW.

Figure 3:
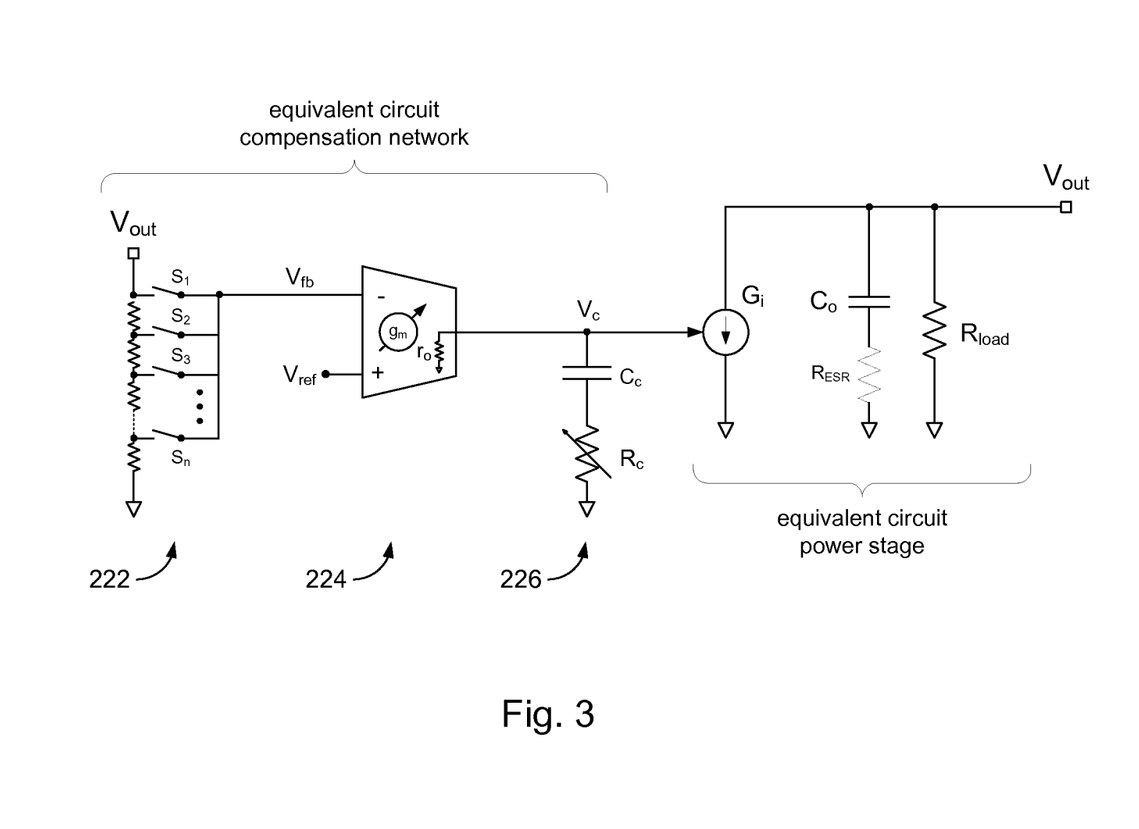
FIG. 3 shows an equivalent circuit diagram of the circuit illustrated in FIG. 2.

Referring to FIG. 3, the discussion will now consider the bandwidth characteristic of the switching regulator circuit 100 (which relates to circuit response time) and the DC open loop gain of the switching regulator circuit (which relates to accuracy of circuit operation). The diagram in FIG. 3 represents an equivalent circuit of the switching regulator circuit 100. Accordingly, an equivalent circuit of the power stage may be represented by a current source $G_i$ (which represents the sense amp 212), the output capacitor $C_o$ and its equivalent series resistance $R_{ESR}$, and the load 112. An equivalent circuit of the programmable compensation network 104 may be represented by the programmable resistor network 222, the programmable transconductance amplifier 224, and the programmable RC filter 226.

Consider first, the DC open loop gain of the switching regulator circuit 100. The open loop transfer function $TF_{power}$ of the power stage may be represented by:

$$TF_{power} = G_i R_{load} \cdot \frac{1+sC_o R_{ESR}}{1+sC_o R_{load}}, \qquad \text{Eqn. 1}$$

where $G_i$ is the current sense gain of the current sense amplifier 212, $R_{load}$ is the value of the load 112, $C_o$ is the values of the output capacitor $C_o$, and $R_{ESR}$ is the value of the equivalent series resistance $R_{ESR}$.

The inductor L is associated with an equivalent resistance, sometimes referred to as the DC resistance (DCR). However, its resistance is sufficiently small that it can be ignored for purposes of the following analysis.

The open loop transfer function $TF_{compensation}$ of the programmable compensation network 104 may be represented by:

$$TF_{compensation} = \frac{V_{ref}}{V_{out}} \cdot g_m r_o \cdot \frac{1+sC_c R_c}{1+sC_c r_o}, \qquad \text{Eqn. 2}$$

where $V_{ref}$ is the voltage level of the reference voltage $V_{ref}$, $V_{out}$ is the voltage level of the output voltage $V_{out}$, $g_m$ is the transconductance of the transconductance amplifier 224, $r_o$ is the output resistance of the transconductance amplifier 224, $C_c$ is the value of the capacitor $C_c$ in the filter 226, and $R_c$ is the value of the resistor $R_c$ in the filter 226.

Recall from above that $$V_{out} = \frac{V_{ref}}{D_r}$$

so the ratio $$\frac{V_{ref}}{V_{out}}$$

represents the voltage divider ratio $D_r$ of the programmable resistor network 222.

The closed loop transfer function $TF_{closedloop}$ of the switching regulator circuit 100 may be defined according to:

$$TF_{closedloop} = TF_{power} \cdot TF_{compensation}, \quad \text{Eqn. 3a}$$

$$TF_{closedloop} = G_i R_{load} \cdot \frac{1+sC_o R_{ESR}}{1+sC_o R_{load}} \cdot \frac{V_{ref}}{V_{out}} \cdot g_m r_o \cdot \frac{1+sC_c R_c}{1+sC_c r_o}, \quad \text{Eqn. 3b}$$

where the DC terms can be collected to produce:

$$TF_{closedloop} = G_i R_{load} \cdot \frac{V_{ref}}{V_{out}} \cdot g_m r_o \cdot \frac{1+sC_o R_{ESR}}{1+sC_o R_{load}} \cdot \frac{1+sC_c R_c}{1+sC_c r_o}. \quad \text{Eqn. 3c}$$

As can be seen from Eqn. 3c, the closed loop transfer function of the switching regulator circuit 100 has a DC open loop gain $A_{DC}$ given by:

$$A_{DC} = G_i R_{load} \cdot \frac{V_{ref}}{V_{out}} \cdot g_m r_o. \quad \text{Eqn. 4}$$

Consider next the bandwidth of the switching regulator circuit 100. The discussion begins with the closed loop transfer function $TF_{closedloop}$ of the switching regulator circuit 100 as expressed in Eqn. 3b. Since the output resistance $r_o$ of the transconductance amplifier 224 is typically high (in principle, infinite), Eqn. 3b can be simplified by first rearranging some terms in the equation:

$$TF_{closedloop} = \quad \text{Eqn. 5a}$$
$$G_i R_{load} \cdot \frac{1+sC_o R_{ESR}}{1+sC_o R_{load}} \cdot \frac{V_{ref}}{V_{out}} \cdot g_m \cdot (1+sC_c R_c) \cdot \frac{r_o}{1+sC_c r_o}.$$

Then, assuming $C_c r_o \gg 1$, the following approximation can be made:

$$\frac{r_o}{1+sC_c r_o} \approx \frac{1}{sC_c}. \quad \text{Eqn. 5b}$$

The closed loop transfer function $TF_{closedloop}$ can then be approximated by:

$$TF_{closedloop} \approx G_i R_{load} \cdot \frac{1+sC_o R_{ESR}}{1+sC_o R_{load}} \cdot \frac{V_{ref}}{V_{out}} \cdot g_m \cdot \frac{1+sC_c R_c}{sC_c}. \quad \text{Eqn. 5c}$$

Figure 4:
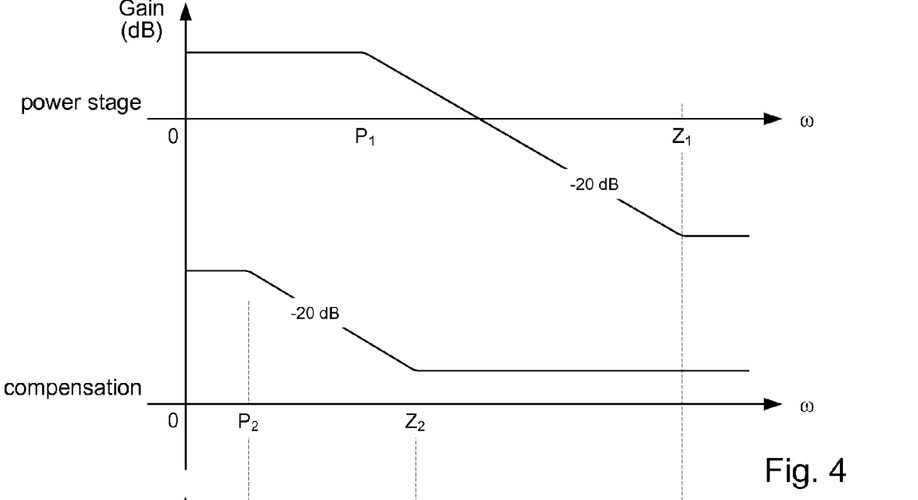
FIG. 4 represents Bode plots of the transfer functions of a power stage and a compensation stage of the circuit illustrated in FIG. 2.
Figure 5:
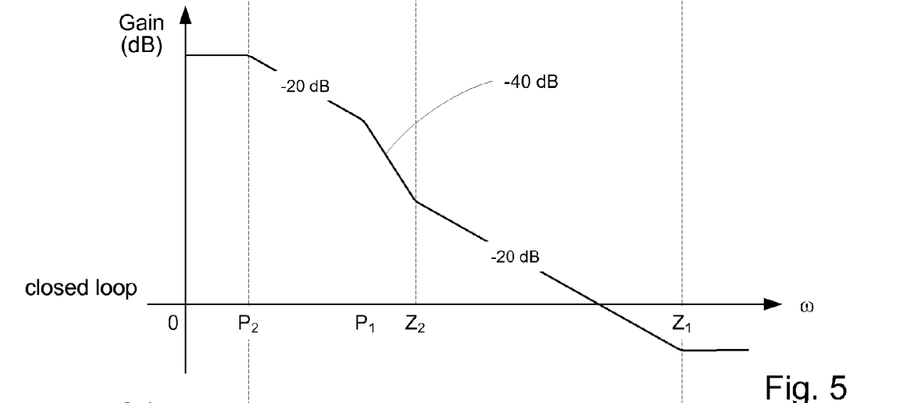
FIG. 5 represents a Bode plot of a closed loop transfer function of the circuit illustrated in FIG. 2.
Figure 6:
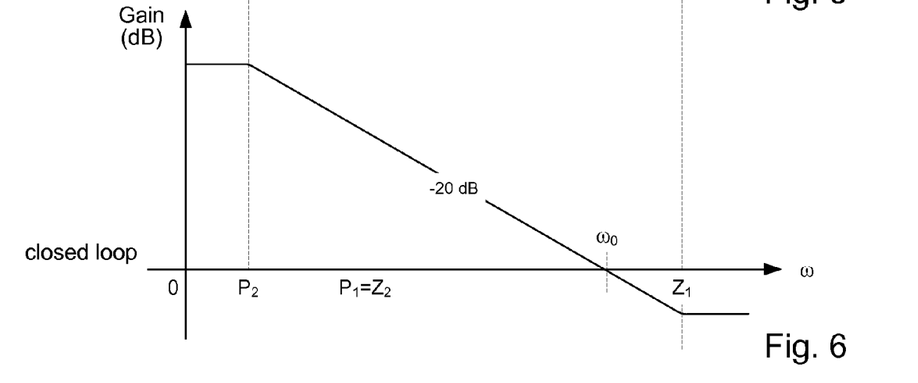
FIG. 6 represents a Bode plot where the pole $P_1$ and the zero $Z_2$ are made equal.

Turning for a moment to FIGS. 4-6, FIG. 4 shows Bode plots of the power stage transfer function (Eqn. 1) and the compensation network transfer function (Eqn. 2). From Eqn. 1, the power stage transfer function $TF_{power}$ has a pole $P_1$ defined at:

$$P_1 = \frac{1}{C_o R_{load}}. \quad \text{Eqn. 6a}$$

and a zero $Z_1$ defined at:

$$Z_1 = \frac{1}{C_o R_{ESR}}. \quad \text{Eqn. 6b}$$

Likewise, from Eqn. 2, the compensation network transfer function $TF_{compensation}$ has a pole $P_2$ defined at:

$$P_2 = \frac{1}{C_c r_o} \quad \text{Eqn. 7a}$$

and a zero $Z_2$ defined at:

$$Z_2 = \frac{1}{C_c R_c}. \quad \text{Eqn. 7b}$$

FIG. 5 shows the Bode plot for the closed loop transfer function (Eqn. 3c) of the switching regulator circuit 100. As can be seen in the Bode plot of FIG. 5, between $P_1$ and $Z_2$ there is a −40 dB slope which indicates a range of frequencies, namely $$f_{P1} = \frac{P_1}{2\pi} \text{ and } f_{Z2} = \frac{Z_2}{2\pi},$$

where the switching regulator circuit 100 may exhibit unstable operation. However, if pole $P_i$ of the power stage transfer function (Eqn. 1) and the zero $Z_2$ of the compensation network transfer function (Eqn. 2) are set equal to each other, then stable operation across the full bandwidth of the switching regulator circuit 100 can be obtained. The resulting Bode plot is shown in FIG. 6, where the zero $Z_2$ has been made equal to the pole $P_1$.

Returning to Eqn. 5c, when $P_1 = Z_2$, it can be shown from Eqn. 5c that the closed loop DC gain of the switching regulator circuit 100 may be expressed as:

$$\text{closed loop DC gain} = G_i R_{load} \cdot \frac{V_{ref}}{V_{out}} \cdot g_m R_c. \quad \text{Eqn. 8}$$

It can be further shown that the crossover frequency $\omega_0$ may be expressed as:

$$\frac{\omega_0}{P_1} = G_i R_{load} \cdot \frac{V_{ref}}{V_{out}} \cdot g_m R_c, \quad \text{Eqn. 9a}$$

and substituting Eqn. 6a:

$$\omega_0 = G_i R_{load} \cdot \frac{V_{ref}}{V_{out}} \cdot g_m R_c \cdot \frac{1}{C_o R_{load}} \quad \text{Eqn. 9b}$$

$$\omega_0 = G_i \cdot \frac{V_{ref}}{V_{out}} \cdot g_m R_c \cdot \frac{1}{C_o}. \quad \text{Eqn. 9c}$$

Eqn. 9c, therefore, represents the bandwidth $\omega_0$ of the switching regulator circuit 100.

The switching regulator circuit 100 of the present disclosure may therefore be characterized by a closed loop transfer function that has a DC open loop gain $A_{DC}$ that can be expressed with Eqn. 4 and a bandwidth $\omega_0$ that can be expressed with Eqn. 9c, both of which are reproduced below as Eqns. 10 and 11 respectively:

$$A_{DC} = G_i R_{load} \cdot \frac{V_{ref}}{V_{out}} \cdot g_m r_o, \quad \text{Eqn. 10}$$

$$\omega_0 = G_i \cdot \frac{V_{ref}}{V_{out}} \cdot g_m R_c \cdot \frac{1}{C_o}. \quad \text{Eqn. 11}$$

Referring back to FIG. 2, since the $g_m$ of the programmable transconductance amplifier 224 is programmable, then programming the $g_m$ will affect both $A_{DC}$ and $\omega_0$. In addition, since the term $$\frac{V_{ref}}{V_{out}}$$

is equal to $D_r$, then programming the voltage divider ratio $D_r$ of the programmable resistor network 222 also will affect both $A_{DC}$ and $\omega_0$. FIG. 2 further shows that the input value R-setting may be used to program suitable values for both $g_m$ and $D_r$. In accordance with principles of the present disclosure, values of $g_m$ are inversely related to corresponding values of $D_r$; as $g_m$ decreases, corresponding values of $D_r$ increase. Thus, as a lower value of $D_r$ is selected to set a higher output voltage $V_{out}$, a higher value for $g_m$ is selected for the programmable transconductance amplifier 224. Conversely, as a higher value of $D_r$ is selected to set a lower output voltage $V_{out}$, a lower value for $g_m$ is selected for the programmable transconductance amplifier 224.

Referring to Eqns. 10 and 11, the inverse relation between $g_m$ and $D_r$ is advantageous because setting the input value R-setting to select a higher operating output voltage $V_{out}$ (hence a lower $D_r$) will tend to reduce the DC open loop gain $A_{DC}$ of the switching regulator circuit 100 and the bandwidth $\omega_0$ of the switching regulator circuit. A lower DC open loop gain results in reduced accuracy in compensating for changes to $V_{out}$. A narrower bandwidth results in a slower response time in responding to changes in $V_{out}$. However, in accordance with the present disclosure, an R-setting that selects a higher operating output voltage $V_{out}$ also selects an increased $g_m$ value, thereby offsetting the tendency to reduce both $A_{DC}$ and $\omega_0$ using the same control, namely, $g_m$.

Conversely, setting the input value R-setting to select a lower operating output voltage $V_{out}$ (hence a higher $D_r$) will tend to increase both $A_{DC}$ and $\omega_0$. An increased $A_{DC}$ may results in unstable operation when compensating for changes to $V_{out}$. However, in accordance with the present disclosure, an R-setting that selects a lower operating output voltage $V_{out}$ also decreases $g_m$, thereby offsetting the tendency to increase $A_{DC}$.

The specific selectable values for $g_m$ and $D_r$, and the resolution of the input value R-setting (i.e., number of bits) are design choices that depend on factors not relevant to the present disclosure. Accordingly, a discussion about specific values for $g_m$ and $D_r$ are beyond the scope of the present disclosure.

Referring again to FIG. 2, in a typical usage case, a circuit designer may design their switching regulator circuit using an IC device comprising device 202, and providing their own components for external filter 206 to drive load 112. In a particular embodiment, for example, suppose the input value R-setting is a four-bit input. The programmable transconductance amplifier 224 and programmable network resistor 222 will have, respectively, sixteen selectable $g_m$ values (e.g., $g_0$ to $g_{15}$, where $g_0 < g_1$, $g_1 < g_2$, ... $g_{14} < g_{15}$) and sixteen selectable $D_r$ values (e.g., $D_0$ to $D_{15}$, where $D_0 > D_1$, $D_1 > D_2$, ... $D_{14} > D_{15}$). In some embodiments, the programmable resistor $R_c$ in the RC filter 226 may be programmed on-chip, in the factory. For example, the programmable resistor $R_c$ may comprise fusible links that are "blown" at the time of manufacture to obtain a certain fixed resistance value.

The circuit designer may decide on a suitable output voltage level $V_{out}$ for their design, and suitable component values for the external filter 206. The circuit designer may then select the closest $D_r$ that will give them their designed $V_{out}$. For example, the circuit designer may use the relationship $$V_{out} = \frac{V_{ref}}{D_r},$$

where $V_{ref}$ is a known value (e.g., 0.8V) to determine $D_r$ and hence the correct value for the input value R-setting. When the circuit designer enters the R-setting value into the device 202, the programmable resistor network 222 may then be configured to provide the selected $D_r$. In accordance with the present disclosure, the entered R-setting value will also serve to configure the programmable transconductance amplifier 224 with a value for $g_m$ that is selected by the entered R-setting value. In a particular embodiment, for example, the entered R-setting value may be stored in a static memory (not shown) on the device 202. When the device 202 is powered, the R-setting value may be read from the static memory and used to program or otherwise configure both the programmable resistor network 222 and the programmable transconductance amplifier 224. Thus, by using one parameter, R-setting, the operating output voltage $V_{out}$ of the switching regulator circuit can be selected, while at the same time maximizing the DC open loop gain as well as the bandwidth.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
    a switching power circuit having a first input for a connection to an input voltage and having a second input, the switching power circuit further having an output to supply an output voltage to a load; and
    a programmable compensation circuit having a selectable transconductance ($g_m$) and comprising an input section for a connection to the load to receive the output voltage across the load and an output section connected to the second input of the switching power circuit to provide a control signal to the switching power circuit,
    the programmable compensation circuit having a first selectable $g_m$ wherein a closed loop transfer function of the circuit is represented by a first transfer function having a first DC open loop gain and a first bandwidth, the programmable compensation circuit having at least a second selectable $g_m$ wherein the closed loop transfer function of the circuit is represented by a second transfer function having a second DC open loop gain and a second bandwidth.

2. The circuit of claim 1 wherein the programmable compensation circuit further comprises a programmable transconductance amplifier having a $g_m$ that sets the $g_m$ of the programmable compensation circuit, wherein the $g_m$ of the programmable transconductance amplifier is selectable.

3. The circuit of claim 2 further comprising an input to receive an input value to select the $g_m$ of the programmable transconductance amplifier.

4. The circuit of claim 3 wherein the input section of the programmable compensation circuit comprises a programmable voltage divider, wherein the input value serves to select the $g_m$ and a voltage divider ratio of the programmable voltage divider.

5. The circuit of claim 1 wherein the input section of the programmable compensation circuit comprises a programmable resistor network.

6. The circuit of claim 5 wherein the programmable resistor network is a voltage divider, the circuit further comprising an input to receive an input value to program a voltage divider ratio of the voltage divider.

7. The circuit of claim 6 wherein the input value is further to program a transconductance ($g_m$) of the programmable compensation circuit.

8. The circuit of claim 1 wherein the output section of the programmable compensation circuit comprises a programmable RC filter.

9. The circuit of claim 1 further comprising a filter circuit connected between the output of the switching power circuit and the load, wherein the filter circuit filters an output of the switching power circuit to produce the output voltage supplied to the load.

10. The circuit of claim 1, wherein the circuit is configured as a buck converter.

11. A method in a circuit comprising:
receiving an input voltage at a switching power circuit;
producing an output of the switching power circuit to be supplied to a load as an output voltage;
accessing a user-provided input value;
using the input value to configure a programmable compensation network with a selectable transconductance ($g_m$);
receiving at an input section of the programmable compensation network the output voltage across the load; and
providing an output from an output section of the programmable compensation network as a control signal to the switching power circuit,
wherein the programmable compensation circuit has a first selectable $g_m$ wherein a closed loop transfer function of the circuit is represented by a first transfer function having a first DC open loop gain and a first bandwidth,
wherein the programmable compensation circuit has at least a second selectable $g_m$ wherein the closed loop transfer function of the circuit is represented by a second transfer function having a second DC open loop gain and a second bandwidth.

12. The method of claim 11 wherein the programmable compensation circuit further comprises a programmable transconductance amplifier having a selectable $g_m$ that sets the $g_m$ of the programmable compensation circuit, the method further comprising selecting a $g_m$ of the programmable transconductance amplifier using the input value.

13. The method of claim 12 wherein the input section of the programmable compensation circuit comprises a programmable voltage divider, the method further comprising also using the input value to select a voltage divider ratio of the programmable voltage divider.

14. The method of claim 11 wherein the input section of the programmable compensation circuit comprises a programmable resistor network.

15. The method of claim 14 wherein the programmable resistor network is a voltage divider, the method further comprising programming a voltage divider ratio of the voltage divider using the input value.

16. The method of claim 11 wherein the output section of the programmable compensation circuit comprises a programmable RC filter.

17. The method of claim 11 further comprising providing the output of the switching power circuit to a filter circuit and supplying an output of the filter circuit as the output voltage to the load.

* * * * *